United States Patent
Chang et al.

(10) Patent No.: US 7,611,949 B2
(45) Date of Patent: Nov. 3, 2009

(54) METHOD OF FABRICATING METAL-OXIDE-SEMICONDUCTOR TRANSISTOR

(75) Inventors: San-Jung Chang, Hsinchu (TW); Jim Lin, Taoyuan County (TW)

(73) Assignee: ProMOS Technologies, Inc., Hsinchu (TW)

( * ) Notice: Subject to any disclaimer, the term of this patent is extended or adjusted under 35 U.S.C. 154(b) by 283 days.

(21) Appl. No.: 11/309,205

(22) Filed: Jul. 13, 2006

(65) Prior Publication Data
US 2007/0259498 A1    Nov. 8, 2007

(30) Foreign Application Priority Data
May 5, 2006    (TW) .................................. 95116002

(51) Int. Cl.
H01L 21/336 (2006.01)
H01L 21/31 (2006.01)
H01L 21/469 (2006.01)

(52) U.S. Cl. ........................ 438/272; 438/268; 438/270; 438/776; 438/770; 257/330; 257/333

(58) Field of Classification Search .................. 438/197, 438/244, 270
See application file for complete search history.

(56) References Cited

U.S. PATENT DOCUMENTS

| | | | |
|---|---|---|---|
| 6,097,062 A | 8/2000 | Gardner et al. | 257/333 |
| 6,956,263 B1 | 10/2005 | Mistry | 257/330 |
| 2001/0036704 A1 * | 11/2001 | Hueting et al. | 438/270 |
| 2003/0235959 A1 * | 12/2003 | Lichtenberger et al. | 438/272 |
| 2004/0259311 A1 * | 12/2004 | Kim | 438/259 |

* cited by examiner

*Primary Examiner*—Ha Tran T Nguyen
*Assistant Examiner*—Valerie Brown
(74) *Attorney, Agent, or Firm*—Jianq Chyun IP Office

(57) ABSTRACT

A method of fabricating a metal-oxide-semiconductor (MOS) transistor is provided. First, a patterned hard mask layer with an opening therein is formed over the substrate. A spacer is formed on the sidewall of the patterned hard mask layer in the opening. An isotropic etching process is performed on the substrate to form a recess in the substrate. An ion implant process is performed on the substrate in the lower portion of the recess using oxidation-restrained ions. The spacer is removed. Then, a thermal process is performed to form a gate oxide layer on the surface of the substrate within the recess such that the gate oxide layer in the upper portion of the recess is thicker than that in the lower portion of the recess.

18 Claims, 3 Drawing Sheets

METHOD OF FABRICATING METAL-OXIDE-SEMICONDUCTOR TRANSISTOR

CROSS-REFERENCE TO RELATED APPLICATION

This application claims the priority benefit of Taiwan application serial no. 95116002, filed on May 5, 2006. All disclosure of the Taiwan application is incorporated herein by reference.

BACKGROUND OF THE INVENTION

1. Field of the Invention

The present invention relates to a method of fabricating a metal-oxide-semiconductor (MOS) transistor, and more particularly, to a method of fabricating a MOS transistor with a recessed channel.

2. Description of Related Art

As the size of semiconductor devices continues to reduce, short channel effect in a conventional planar metal-oxide-semiconductor (MOS) transistor is often intensified due to a reduction in channel length so that the device is prevented from operating normally. Therefore, as the channel length is reduced, the amount of dopants within the channel is often increased to minimize the short channel effect. However, excess dopants in the channel lead to another problem, namely, an increase in the leakage current.

As a result, MOS transistor having a recessed channel has been developed. The recessed channel not only reduces the size of the device, but also effectively increases the channel length and improves the short channel effect.

Although a recessed channel in the MOS transistor can improve short channel effect, the MOS transistor with a recessed channel has a larger gate-to-drain overlap region when compared with a conventional planar MOS transistor.

In general, a larger gate-to-drain overlap region causes a gate-induced drain leakage (GIDL) current, thereby increasing the standby current. In addition, when the MOS transistor with a recessed channel is applied to a dynamic random access memory, the gate-induced drain leakage current results in a lowering of the retention time of the dynamic random access memory. On the other hand, the capacitance produced by the larger gate-to-drain overlap region causes an increase in gate delay as well as a lowering of device speed.

SUMMARY OF THE INVENTION

Accordingly, at least one objective of the present invention is to provide a method of fabricating a metal-oxide-semiconductor (MOS) transistor that can effectively suppress gate-induced drain leakage current.

At least another objective of the present invention is to provide a method of fabricating a metal-oxide-semiconductor (MOS) transistor that can effectively lower the capacitance produced by a gate-to-drain overlap region.

To achieve these and other advantages and in accordance with the purpose of the invention, as embodied and broadly described herein, a method of fabricating a MOS transistor is provided. A patterned hard mask layer with an opening therein is formed over the substrate. A spacer is formed on the sidewall of the patterned hard mask layer in the opening. Using the patterned hard mask layer and the spacer as a mask, an isotropic etching process is performed on the substrate to form a recess in the substrate. Using the patterned hard mask layer and the spacer as a mask, an ion implant process using oxidation-restrained ions is performed on the substrate in the lower portion of the recess. The spacer is removed. A thermal process is performed to form a gate oxide layer on the surface of the substrate within the recess such that the gate oxide layer in the upper portion of the recess is thicker than that in the lower portion of the recess.

According to the foregoing method of fabricating MOS transistor in one preferred embodiment of the present invention, the ion implant process includes a tilted ion implant process.

According to the foregoing method of fabricating MOS transistor in one preferred embodiment of the present invention, the oxidation-restrained ions include nitrogen ions.

According to one preferred embodiment of the present invention, the foregoing method of fabricating MOS transistor further includes forming a gate on the gate oxide layer such that the gate protrudes above the recess. The patterned hard mask layer is removed. A source/drain region is formed in the substrate on two sides of the gate, respectively.

According to the foregoing method of fabricating MOS transistor in one preferred embodiment of the present invention, the method of forming the gate includes, before removing the patterned hard mask layer, forming a conductive layer over the substrate to fill up the recess and the opening. After that, the conductive layer outside the opening is removed.

According to the foregoing method of fabricating MOS transistor in one preferred embodiment of the present invention, the method of removing the conductive layer outside the opening includes performing a chemical-mechanical polishing process.

According to the foregoing method of fabricating MOS transistor in one preferred embodiment of the present invention, the method of forming the gate includes, after removing the patterned hard mask layer, forming a conductive layer over the substrate to fill up the recess. After that, the conductive layer aside the recess is removed.

According to one preferred embodiment of the present invention, the foregoing method of fabricating MOS transistor further includes, before forming the patterned hard mask layer, forming a pad oxide layer on the substrate.

According to one preferred embodiment of the present invention, the foregoing method of fabricating MOS transistor further includes, before performing the ion implant process on the substrate, forming a sacrificial oxide layer on the substrate in the recess. After performing the ion implant process on the substrate, the sacrificial oxide layer is removed.

Another aspect of the present invention also provides a method of fabricating a MOS transistor. A patterned hard mask layer with an opening therein is formed over the substrate. A spacer is formed on the sidewall of the patterned hard mask layer in the opening. Using the patterned hard mask layer and the spacer as a mask, an anisotropic etching process is performed on the substrate to remove a portion of the substrate. Using the patterned hard mask layer and the spacer as a mask, an isotropic process is performed on the substrate to form a recess in the substrate. Using the patterned hard mask layer and the spacer as a mask, an ion implant process using oxidation-restrained ions is performed on the substrate in the lower portion of the recess. The spacer is removed. A thermal process is performed to form a gate oxide layer on the surface of the substrate within the recess such that the gate oxide layer in the upper portion of the recess is thicker than that in the lower portion of the recess.

Accordingly, the aforementioned method of fabricating MOS transistor involves forming a thicker oxide layer in the upper portion of the recess (the gate-to-drain overlap region) on the substrate and a thinner oxide layer in the lower portion of the recess (the channel region) on the substrate. Hence, the capacitance produced by the gate-to-drain overlap region is lowered, and problems about gate delay and device speed are minimized. Furthermore, gate-induced drain leakage current is effectively suppressed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
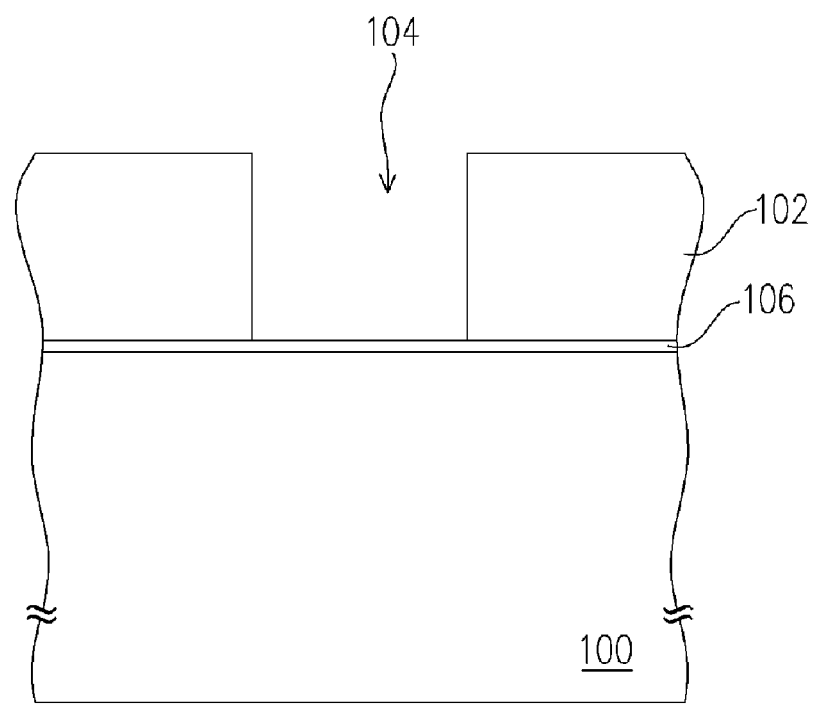
FIGS. 1A through 1F are schematic cross-sectional views showing the steps of fabricating a metal-oxide-semiconductor transistor.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic cross-sectional views showing the steps of fabricating a metal-oxide-semiconductor transistor.

First, as shown in FIG. 1A, a patterned hard mask layer 102 having an opening 104 formed therein is formed above a substrate 100. The substrate 100 is a silicon substrate, for example. The material constituting the patterned hard mask layer 102 includes, for example, silicon nitride. The method of forming the patterned hard mask layer 102 includes, for example, forming a hard mask layer (not shown) over the substrate 100 in a chemical vapor deposition process and performing a patterning process on the hard mask layer thereafter.

In addition, before forming the patterned hard mask layer 102, a pad oxide layer 106 may be formed on the substrate 100 to increase the adhesion of the patterned hard mask layer 102 to the substrate 100. The material constituting the pad oxide layer 106 includes, for example, silicon oxide. The method of forming the pad oxide layer 106 includes, for example, performing a thermal oxidation process.

Figure 1B:
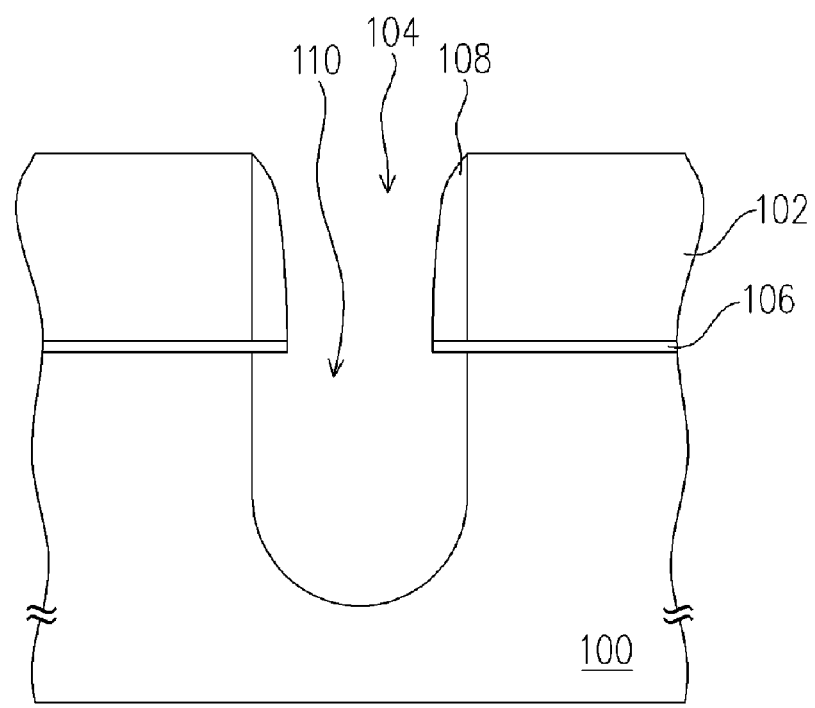

As shown in FIG. 1B, a spacer 108 is formed on the sidewall of the patterned hard mask layer 102 in the opening 104. The material constituting the spacer includes, for example, silicon oxide. The method of forming the spacer 108 includes, for example, forming a conformal spacer material layer (not shown) over the patterned hard mask layer 102 and the pad oxide layer 106 in a chemical vapor deposition process and performing an anisotropic etching process on the spacer material layer thereafter. Furthermore, during the anisotropic etching process, a portion of the pad oxide layer 106 is simultaneously removed so that the opening 104 exposes a portion of the substrate 100.

Next, using the patterned hard mask layer 102 and the spacer 108 as a mask, an isotropic etching process is performed on the substrate 100 to form a recess 110. The recess 110 can be divided into an upper portion 110a and a lower portion 110b. The upper portion 110a of the recess 110 corresponds to the designated location for subsequently forming the source/drain region. It should be noted that, before performing the isotropic etching process, an anisotropic etching process using the patterned hard mask layer 102 and the spacer 108 as a mask may be performed to deepen the recess 110.

Figure 1C:
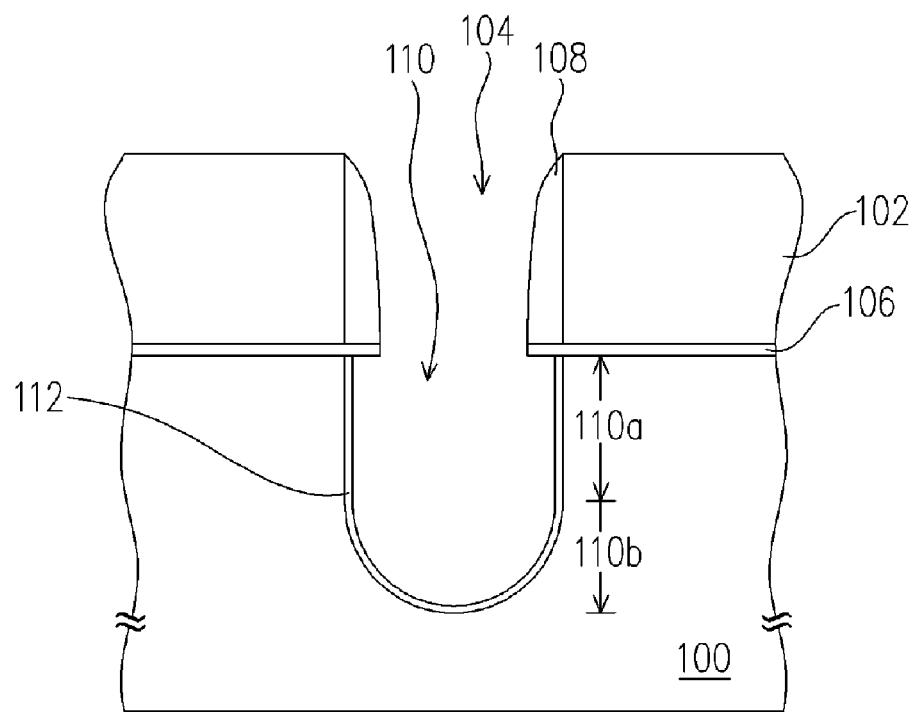

As shown in FIG. 1C, using the patterned hard mask layer 102 and the spacer 108 as a mask, an ion implant process using oxygen-restrained ions is performed on the substrate 100 in the lower portion 110b of the recess 110. The ion implant process is, for example, a tilted ion implant process with a tilting angle set from −30° to 30° and an ion implant dosage set between $1\times10^{13}$ and $5\times10^{15}$ atom/cm$^2$. The oxygen-restrained ions are, for example, nitrogen ions. The reactive gas used in the ion implant process includes, for example, nitrogen ($N_2$), nitrogen oxide (NO) or nitrous oxide ($N_2O$).

In addition, before performing the ion implant process on the substrate 100, a sacrificial oxide layer 112 may be formed on the substrate 100 in the recess 110. The method of forming the sacrificial layer 112 includes, for example, performing a thermal oxidation process.

Figure 1D:
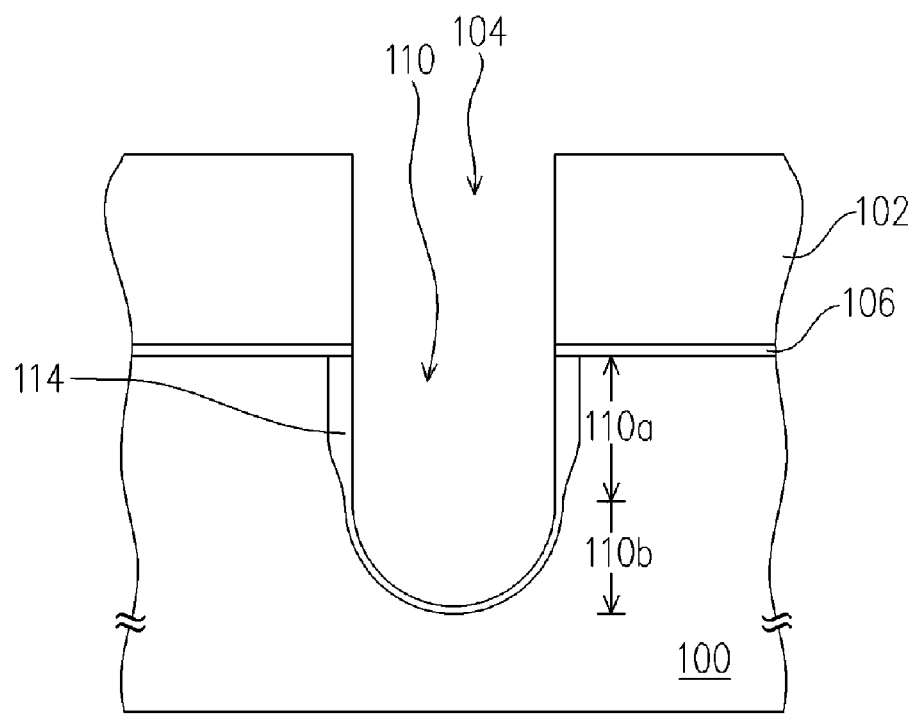

As shown in FIG. 1D, the spacer 108 is removed. The method of removing the spacer 108 includes, for example, performing an isotropic etching process, such as a wet etching process. Furthermore, the pad oxide layer 106 and the sacrificial oxide layer 112 underneath the spacer 108 can be removed along with the spacer 108 in the isotropic etching process.

After that, a thermal oxidation process is performed on the substrate 100 to form a gate oxide layer 114 on the surface of the substrate 100 in the recess 110. Because the oxygen-restrained ions that inhibit oxidation are implanted into the substrate 100 in the lower portion 110b of the recess 110 in a foregoing process, the gate oxide layer 114 growing at the upper portion 110a of the recess 110 is thicker than that at the lower portion 110b of the recess 110. The ratio of the thickness of the gate oxide layer 114 in the upper portion 110a of the recess 110 to the thickness of the gate oxide layer 114 in the lower portion 110b of the recess 110 is, for example, 1.1 to 5.

Figure 1E:
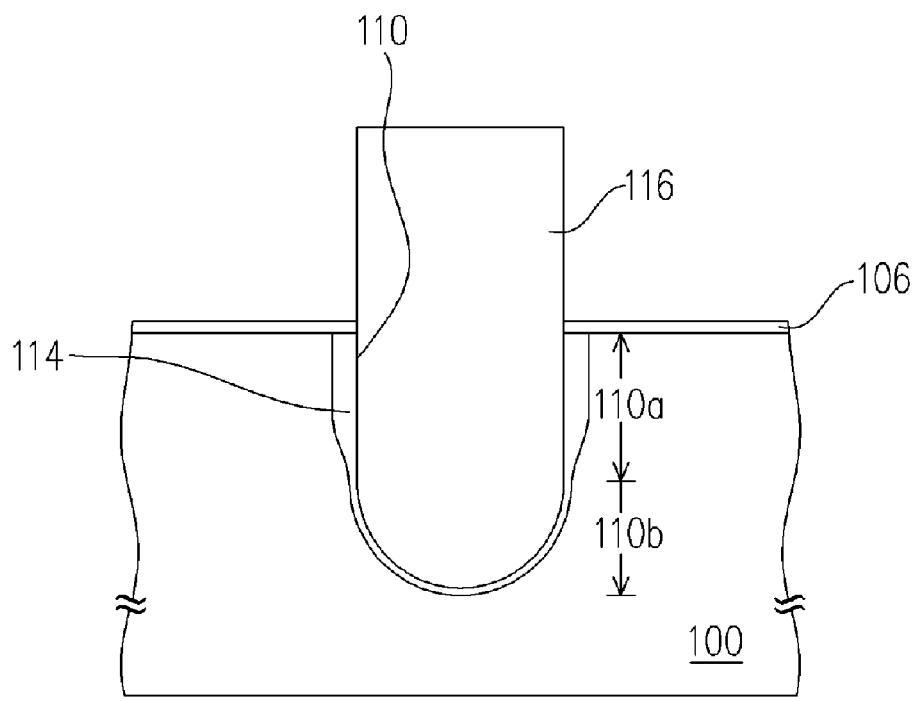

As shown in FIG. 1E, a gate 116 is formed on the gate oxide layer 114. Furthermore, the gate 116 protrudes above the recess 110. In one embodiment, the method of forming the gate 116 includes, for example, forming a conductive layer (not shown) over the substrate 100 to fill up the recess 110 and the opening 104, and removing the conductive layer outside the opening 104 thereafter. The material constituting the conductive layer includes, for example, doped polysilicon or a metallic substance, such as tungsten nitride. The method of removing the conductive layer outside the opening 104 includes performing a chemical-mechanical polishing process using the patterned hard mask layer 102 as a polishing stop layer, for example.

Next, the patterned hard mask layer 102 is removed. The method of removing the patterned hard mask layer 102 includes, for example, performing an anisotropic etching process, such as a dry etching process.

In another embodiment, the method of forming the gate 116 includes removing the patterned hard mask layer 102 first. Then, a conductive layer (not shown) is formed over the substrate 100 to fill the recess 110. The material constituting the conductive layer includes, for example, doped polysilicon or a metallic substance, such as tungsten nitride. After that, the conductive layer not right over the recess 110 is removed by performing a patterning process on the conductive layer, for example.

Figure 1F:
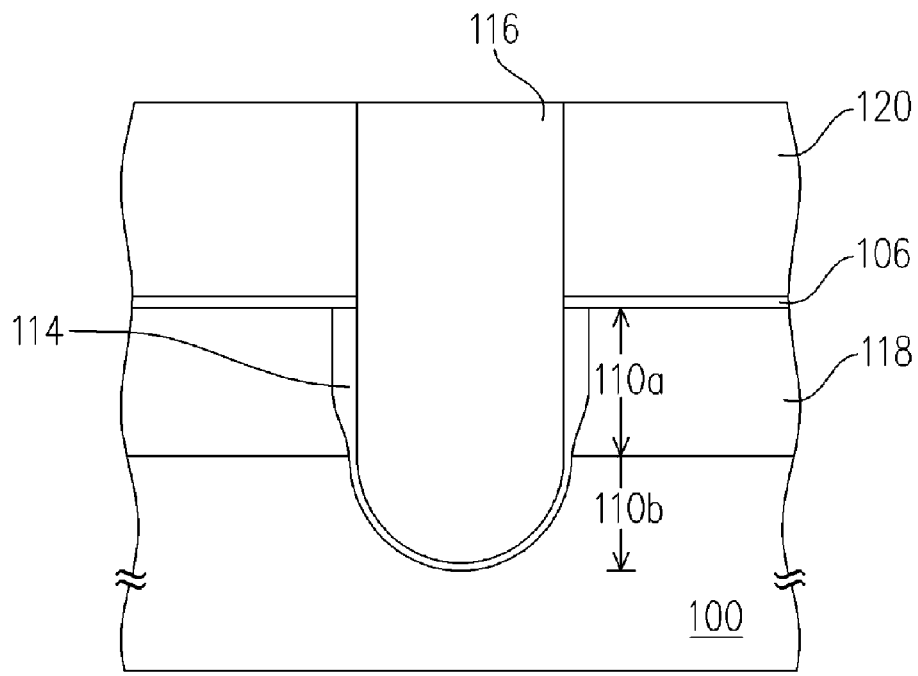

As shown in FIG. 1F, source/drain regions 118 are formed in the substrate 100 on two sides of the gate 116, respectively.

Depth of the source/drain regions 118 substantially corresponds to the bottom level of the upper portion 110a of the recess 110. The method of forming the source/drain regions 118 includes, for example, performing an ion implant process using the gate 116 as an ion implant mask.

Then, a dielectric layer 120 is formed on two sides of the gate 116 above the recess 110. The dielectric layer 120 is formed of a silicon oxide layer, for example. The method of forming the dielectric layer 120 includes, for example, forming a dielectric material layer (not shown) on the pad oxide layer 106 in a chemical vapor deposition process, and performing a chemical-mechanical polishing process on the dielectric material layer using the gate 116 as a polishing stop layer.

The MOS transistor fabricated according to the foregoing embodiments has a recessed channel. Furthermore, the gate oxide layer 114 on the upper portion 110a of the recess 110 (i.e. the gate oxide layer 114 between the gate 116 and the source/drain region 118) is relatively thicker. As a result, the capacitance produced by the overlapping region between the gate 116 and the source/drain region 118 is reduced. Also, the problems, such as gate delay and lowering of device speed, are minimized, and gate-induced drain leakage current is decreased.

In addition, while the foregoing method of fabricating a MOS transistor with a recessed channel is applied to the fabrication of a dynamic random access memory (DRAM), the resultant memory has a longer data retention time and a lower coupling capacitance from bit lines.

In summary, the present invention has at least the following advantages.

1. According to the method of fabricating a MOS transistor of the present invention, the gate oxide layer with a greater thickness is fabricated between the gate and the source/drain region. Hence, gate-induced drain leakage current is effectively suppressed.

2. The MOS transistor fabricated thereby possesses a reduced capacitance produced by the overlapping region between the gate and the source/drain region so that problems about gate delay and lowering of device speed are minimized.

3. By applying the method of fabricating a MOS transistor to the production of a dynamic random access memory, the data retention time of memory is increased and the coupling capacitance of the bit lines is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a metal-oxide-semiconductor transistor, comprising:
   forming a patterned hard mask layer on a substrate, wherein the patterned hard mask layer has an opening formed therein;
   forming a spacer on a sidewall of the patterned hard mask layer in the opening;
   using the patterned hard mask layer and the spacer as a mask, performing an isotropic etching process on the substrate to form a recess in the substrate, wherein the recess includes an upper portion and a lower portion;
   using the patterned hard mask layer and the spacer as a mask, performing an ion implant process using oxygen-restrained ions on the substrate in the lower portion of the recess;
   removing the spacer; and
   performing a thermal oxidation process to form a gate oxide layer on a surface of the substrate within the recess such that a thickness of the gate oxide layer in the upper portion of the recess is greater than that of the gate oxide layer in the lower portion of the recess.

2. The method of claim 1, wherein the ion implant process comprises a tilted ion implant process.

3. The method of claim 1, wherein the oxygen-restrained ions comprise nitrogen ions.

4. The method of claim 1, further comprises:
   forming a gate over the gate oxide layer, wherein the gate protrudes above the recess;
   removing the patterned hard mask layer; and
   forming a source/drain region in the substrate on a side of the gate.

5. The method of claim 4, wherein the method of forming the gate comprises:
   before removing the patterned hard mask layer, forming a conductive layer over the substrate to fill the recess and the opening; and
   removing the conductive layer outside the opening.

6. The method of claim 5, wherein the method of removing the conductive layer outside the opening comprises performing a chemical-mechanical polishing process.

7. The method of claim 4, wherein the method of forming the gate comprises:
   after removing the patterned hard mask layer, forming a conductive layer over the substrate to fill the recess; and
   removing the conductive layer not right over the recess.

8. The method of claim 1, further comprising before forming the patterned hard mask layer, forming a pad oxide layer on the substrate.

9. The method of claim 1, further comprising before performing the ion implant process on the substrate, forming a sacrificial oxide layer on the substrate within the recess, and after performing the ion implant process, removing the sacrificial oxide layer.

10. A method of fabricating a metal-oxide-semiconductor transistor, comprising:
    forming a patterned hard mask layer over a substrate, wherein the patterned hard mask layer has an opening formed therein;
    forming a spacer on a sidewall of the patterned hard mask layer in the opening;
    using the patterned hard mask layer and the spacer as a mask, performing an anisotropic etching process on the substrate to remove a portion of the substrate in the opening;
    using the patterned hard mask layer and the spacer as a mask, performing an isotropic etching process on the substrate to form a recess in the substrate in the opening;
    using the patterned hard mask layer and the spacer as a mask, performing an ion implant process on the substrate in a lower portion of the recess using oxygen-restrained ions;
    removing the spacer; and
    performing a thermal oxidation process to form a gate oxide layer on a surface of the substrate within the recess such that a thickness of the gate oxide layer in an upper portion of the recess is greater than that of the gate oxide layer in the lower portion of the recess.

11. The method of claim 10, wherein the ion implant process comprises a tilted ion implant process.

12. The method of claim 10, wherein the oxygen-restrained ions comprise nitrogen ions.

13. The method of claim 10, further comprising:
  forming a gate on the gate oxide layer, wherein the gate protrudes above the recess;
  removing the patterned hard mask layer; and
  forming a source/drain region in the substrate on a side of the gate.

14. The method of claim 13, wherein the method of forming the gate comprises:
  before removing the patterned hard mask layer, forming a conductive layer over the substrate to fill the recess and the opening; and
  removing the conductive layer outside the opening.

15. The method of claim 14, wherein the method of removing the conductive layer outside the opening comprises performing a chemical-mechanical polishing process.

16. The method of claim 13, wherein the method of forming the gate comprises:
  after removing the patterned hard mask layer, forming a conductive layer over the substrate to fill the recess; and
  removing the conductive layer not right over the recess.

17. The method of claim 10, further comprising before forming the patterned hard mask layer, forming a pad oxide layer on the substrate.

18. The method of claim 10, further comprising before performing the ion implant process on the substrate, forming a sacrificial oxide layer on the substrate within the recess, and after performing the ion implant process, removing the sacrificial oxide layer.

* * * * *